United States Patent
Bonicatto

(10) Patent No.: US 11,469,155 B2
(45) Date of Patent: Oct. 11, 2022

(54) FLEXIBLE THERMAL COUPLING FOR A HEAT PIPE

(71) Applicant: Landis+Gyr Innovations, Inc., Alpharetta, GA (US)

(72) Inventor: Damian Bonicatto, Pequot Lakes, MN (US)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 366 days.

(21) Appl. No.: 16/738,052

(22) Filed: Jan. 9, 2020

(65) Prior Publication Data

US 2021/0217683 A1     Jul. 15, 2021

(51) Int. Cl.
*H01L 23/427*     (2006.01)
*F28D 15/02*      (2006.01)
*H05K 1/02*       (2006.01)

(52) U.S. Cl.
CPC ........ *H01L 23/427* (2013.01); *F28D 15/0241* (2013.01); *F28D 15/0275* (2013.01); *H05K 1/0203* (2013.01); *H05K 2201/064* (2013.01); *H05K 2201/066* (2013.01)

(58) Field of Classification Search
CPC ..... H01L 23/42; H01L 23/427; H01L 23/433; H01L 21/4871; H01L 21/4882; H01L 35/30; F28F 2013/006; F28F 21/02; F28F 2255/02; F28D 15/0241; F28D 15/0275; F28D 15/0208; F28D 15/02; H05K 1/0203; H05K 7/2039; H05K 2201/066; H05K 7/20336; H05K 7/20454; H05K 7/20445; H05K 7/20472
See application file for complete search history.

(56) References Cited

U.S. PATENT DOCUMENTS

| | | | | |
|---|---|---|---|---|
| 5,513,070 A | * | 4/1996 | Xie .......................... | G06F 1/203 361/720 |
| 6,084,769 A | * | 7/2000 | Moore ..................... | G06F 1/203 361/679.52 |
| 6,313,987 B1 | * | 11/2001 | O'Connor ............. | G06F 1/1632 165/104.33 |
| 2001/0040788 A1 | * | 11/2001 | O'Connor ............. | G06F 1/1632 361/679.46 |
| 2005/0088822 A1 | * | 4/2005 | Oberlin ............... | H01L 23/4275 257/E23.088 |

(Continued)

*Primary Examiner* — Adam B Dravininkas
(74) *Attorney, Agent, or Firm* — Kilpatrick Townsend & Stockton LLP

(57) ABSTRACT

A device in a utility distribution system may comprise a housing, a heat source, a first heat sink, a second heat sink, a heat pipe, and a flexible directional thermal interface material ("DTIM") with a high-conductivity orientation. The first heat sink may be thermally coupled to the heat source. The second heat sink may be attached to the first heat sink, and the flexible DTIM and the heat pipe may be arranged between the first and second heat sinks. The flexible DTIM may be thermally coupled with the first heat sink and the heat pipe. The heat pipe may be capable of movements with respect to the flexible DTIM. During the movements, the heat pipe may maintain the thermal coupling with the flexible DTIM, such that heat present in the first heat sink may be transferred to the heat pipe via the high-conductivity orientation of the flexible DTIM.

19 Claims, 8 Drawing Sheets

(56) References Cited

U.S. PATENT DOCUMENTS

| | | | |
|---|---|---|---|
| 2006/0060328 A1* | 3/2006 | Ewes | H01L 23/4338 165/185 |
| 2006/0087816 A1* | 4/2006 | Ewes | H01L 23/427 257/E23.088 |
| 2011/0220328 A1* | 9/2011 | Huang | F28D 15/046 29/890.032 |
| 2018/0284856 A1* | 10/2018 | Shah | G06F 1/206 |

* cited by examiner

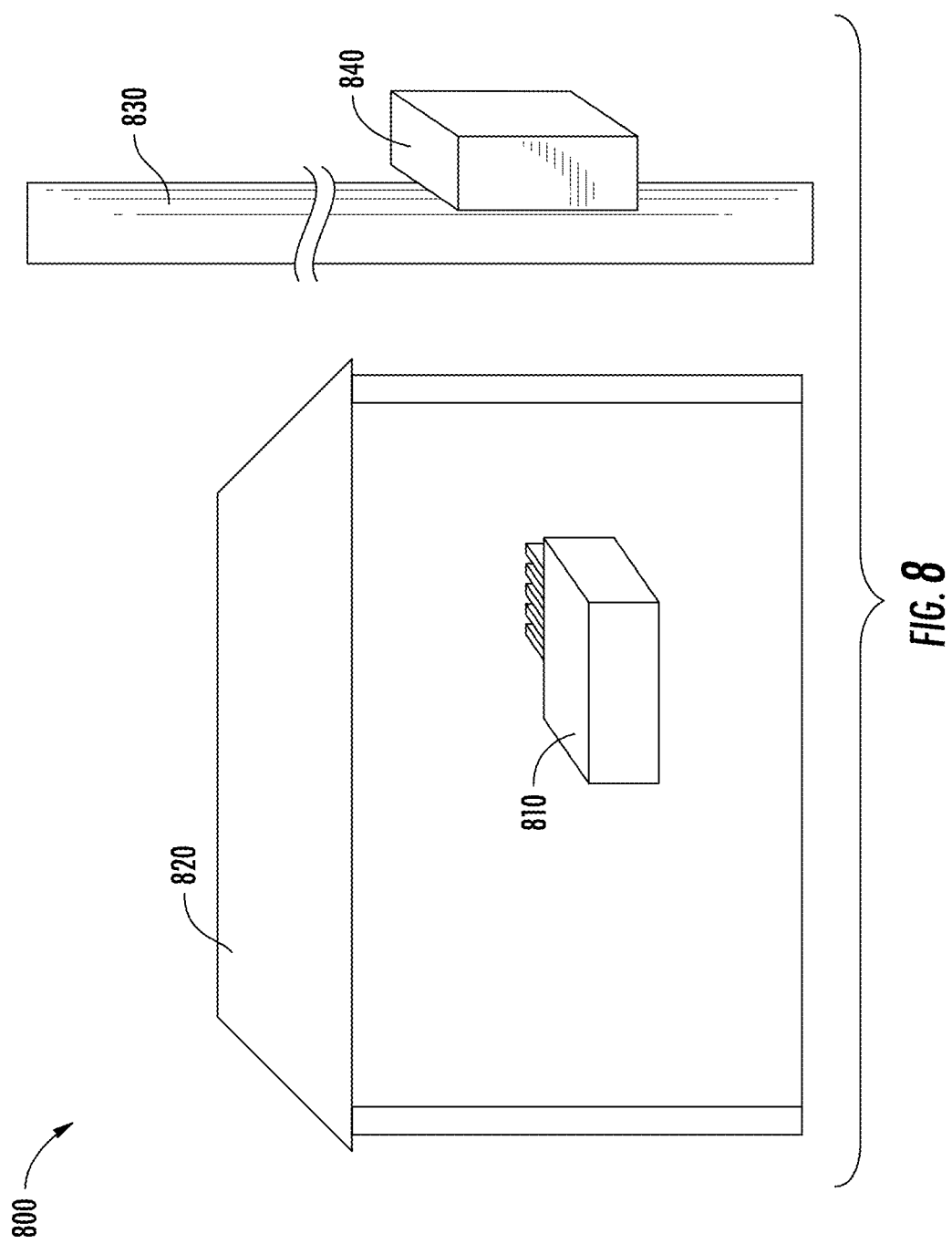

FLEXIBLE THERMAL COUPLING FOR A HEAT PIPE

TECHNICAL FIELD

This disclosure relates generally to the field of thermal management, and more specifically relates to a heat pipe with a flexible mounting.

BACKGROUND

A device, such as a utility management device in a utility distribution system, may include an integrated circuit ("IC") that produces heat during operation. The device may be outfitted with thermal management components to transfer the heat, such as a heat pipe that is arranged to transfer heat from the IC to outside of a housing of the device. However, the device may experience sudden motion while used in the utility distribution system, such as motion resulting from handling during shipping and installation, wind, sudden temperature changes, or other sources of physical movements. The movements of the device may cause movement of the heat pipe relative to the IC.

In a conventional arrangement of thermal management components, movements of the heat pipe relative to the IC may damage the IC or other components in the device. Damage to the IC or other components may increase a likelihood of failure, and could result in improper operation of the device, as well as increasing costs related to replacement or maintenance.

SUMMARY

According to certain implementations, a device of a utility distribution system may comprise a housing, an IC, a first heat sink, a second heat sink, a flexible directional thermal interface material ("DTIM"), and a heat pipe. The IC may be mounted to a printed circuit board within the housing. The first heat sink may be thermally coupled to the IC. In addition, the first heat sink may have a void region. The second heat sink may be attached to the first heat sink, such that the second heat sink substantially encloses the void region. The flexible DTIM may be arranged within the void region between the first heat sink and the second heat sink. The flexible DTIM may have a high-conductivity orientation. The high-conductivity orientation may provide a high rate of heat transfer between a first surface of the flexible DTIM and a second surface of the flexible DTIM. The heat pipe may be arranged between the first heat sink and the second heat sink. In addition, the heat pipe may compress at least a portion of the flexible DTIM. The first surface of the flexible DTIM may be thermally coupled with the heat pipe. The second surface of the flexible DTIM may be thermally coupled with the first heat sink. The heat pipe may be capable of movements with respect to the flexible DTIM. During the movements, the first surface may maintain the thermal coupling with the heat pipe and the second surface may maintain the thermal coupling with the first heat sink. During the movements, heat that is present in the first heat sink may be transferred to the heat pipe via the high-conductivity orientation of the flexible DTIM.

According to certain implementations, a flexible thermal coupling may comprise a heat sink a heat pipe, and a flexible DTIM. The heat sink may be thermally coupled to a heat source. The heat pipe may be thermally coupled to an additional heat sink. The flexible DTIM may have a high-conductivity orientation. The high-conductivity orientation may provide a high rate of heat transfer between a first surface of the flexible DTIM and a second surface of the flexible DTIM. The flexible DTIM may be arranged between the heat sink and the heat pipe. In addition, the heat sink may be thermally coupled to the heat pipe via the flexible DTIM. The heat pipe may be capable of movements with respect to one or more of the heat sink or the additional heat sink. During the movements, the first surface may maintain the thermal coupling with the heat sink and the second surface may maintain the thermal coupling with the heat pipe. During the movements, heat that is present in the heat sink may be transferred to the heat pipe via the high-conductivity orientation of the flexible DTIM.

These illustrative implementations are mentioned not to limit or define the disclosure, but to provide examples to aid understanding thereof. Additional implementations are discussed in the Detailed Description, and further description is provided there.

BRIEF DESCRIPTION OF THE DRAWINGS

Features, implementations, and advantages of the present disclosure are better understood when the following Detailed Description is read with reference to the accompanying drawings, where:

FIG. 8 is a block diagram depicting an example of a utility distribution system that includes one or more utility management devices having flexible thermal couplings, according to certain implementations.

DETAILED DESCRIPTION

Figure 1:
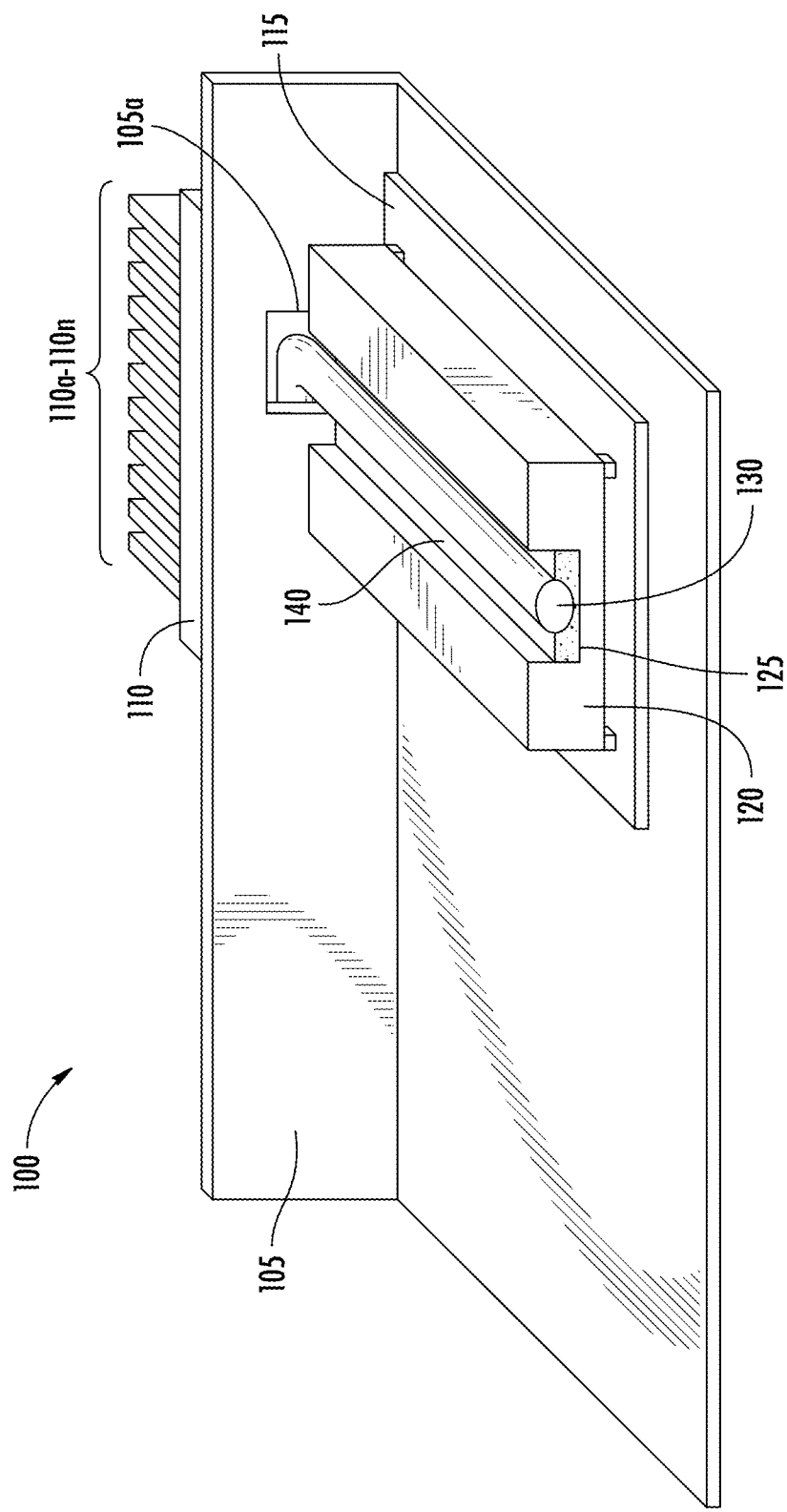
FIG. 1 is an isometric view of an example utility management device included in a utility distribution system, according to certain implementations.

As discussed above, conventional thermal management techniques do not provide for movements of a heat pipe or heat sink in a device. Certain implementations described herein enable motion of a heat pipe or heat sink, such as movements of a heat pipe relative to an IC that is included within the utility management device. For example, the heat pipe and heat sink may be thermally coupled via a flexible DTIM that is capable of maintaining a thermal coupling during movements of the heat pipe or heat sink.

The following examples are provided to introduce certain implementations of the present disclosure. A utility management device in a utility distribution system may include an IC and a heat sink that are enclosed within a housing. The utility management device may also include a heat pipe that is partially enclosed within the housing, and partially extends outside of the housing. The heat pipe, heat sink, and IC may be thermally coupled, such that heat generated by the IC is transferred to the heat sink, and heat present in the heat sink is transferred to the heat pipe. The heat pipe may be configured to transfer the heat outside of the housing, such as to another heat sink, a fan, or other component for dispersion of heat. In addition, the heat pipe and heat sink may be thermally coupled via a DTIM. The DTIM may provide a relatively high rate of heat transfer in a particular direction or orientation. In addition, the DTIM may be flexible, such that the thermal coupling between the flexible DTIM and the heat sink is maintained during movements of the heat sink, and the thermal coupling between the flexible DTIM and the heat pipe is maintained during movements of the heat pipe.

In some cases, inclusion of one or more flexible thermal couplings may improve performance of a utility management device, or components included in the utility management device. For example, a flexible thermal coupling may improve operation and/or lifespan of one or more ICs, such as by maintaining thermal coupling during movements caused by physical forces experienced by the device. In addition, a flexible thermal coupling may improve reliability and/or extend lifespan of a utility management device, such as by preventing breakage of internal components (e.g., solder joints, IC pins, physical fastenings). Furthermore, a flexible thermal coupling may reduce a likelihood of failure of a utility management device, and could result in improved operation of the device, as well as reducing costs related to replacement or maintenance.

As used herein, the terms "thermal coupling" and "thermally coupled" refer to an arrangement of components that provides for a relatively high rate of heat transfer between the arranged components. An example thermal coupling may include at least two components, one which generally provides heat and one which generally receives heat. In addition, the example thermal coupling may include additional components that provide for transfer of heat, such as a thermally conductive grease, paste, paper, or other thermally conductive material. The example thermal coupling between the at least two components may include one or more of the additional components arranged between the at least two components, such as (without limitation) a thermally conductive paste that is arranged between an IC and a heat sink.

As used herein, the term "high-conductivity orientation" of a thermally conductive component refers to an orientation that provides a relatively high rate of heat transfer. A high-conductivity orientation of an example thermally conductive component may provide a relatively high rate of heat transfer in a particular direction through the example component, such as along a Z-axis of the example component. In addition, the high-conductivity orientation of the example component may provide a relatively low rate of heat transfer in additional directions through the example component, such as along an X-axis or Y-axis of the example component.

Referring now to the drawings, FIG. 1 is an isometric view of an example configuration of a device 100. The device 100 may be a utility management device that is included in a utility distribution system, such as a meter, a collector, a router, or other type of device that is capable of gathering data regarding consumption of a measured utility. In some cases, the device 100 may be installed (or configured to be installed) in an outdoor or partially outdoor environment, such as a substation, a utility pole, a utility access structure, or another suitable location. The device 100 may be exposed to physical motions during use in the utility distribution system, such as movements caused by shipping, installation, maintenance, wind, temperature changes, animals, or other sources of motion.

The device 100 may include a housing 105 that encloses (or substantially encloses) some or all of the components of the device 100. One or more components may be installed within the housing 105, such as a printed circuit board ("PCB") 115, a heat sink 120, a heat pipe 130, and a flexible DTIM 140. The PCB 115 may be attached to a lower panel of the housing 105. The heat pipe 130 may extend to the exterior of the housing 105, such as via an aperture 105a on a back panel of the housing 105. In some cases, one or more of the lower panel or the back panel may move relative to each other or relative to the heat pipe 130, such as movements resulting from motion of the housing 105. For example, the back panel of the housing 105 could move from a position perpendicular to the heat pipe 130 to a position that is angled with respect to the heat pipe 130.

The heat pipe 130 may have a thermal coupling with an additional heat sink 110 included in the device 100. The heat sink 110 may be attached external to the housing 105, such that it is thermally coupled to the portion of the heat pipe 130 that extends to the exterior of the housing 105. In some cases, the external heat sink 110 may have one or more fins, such as fins 110a through 110n. In addition, one or more of the external heat sink 110 or fins 110a-110n may be thermally coupled to (or otherwise interact with) an additional thermal management component, such as a fan, and air channel, a vent, or other component that is configured to disperse thermal output of the device 100.

In FIG. 1, the housing 105 is depicted as having a lower panel and a back panel, but other configurations are possible, such as additional panels covering upper or lateral areas of the device 100. For instance, the device 100 may have a lid. In FIG. 1, components and features of the device 100 may be described as having relative configurations, such as a "lower surface" or a "back panel," but these descriptions are for convenience, and are not to be considered limiting. For example, a "lower surface" could be also described as a "side surface," such as if the device 100 is installed horizontally or vertically (e.g., relative to the orientation depicted in FIG. 1).

Within the housing 105, the PCB 115 may have one or more ICs attached. The one or more ICs may be thermally coupled to the heat sink 120, such as a thermal coupling between a lower surface of the heat sink 120 and a surface of the one or more ICs. Heat generated by the one or more ICs is transferred to the heat sink 120 via the thermal coupling. The heat sink 120 may have at least one void region, such as a channel 125. The heat sink 120 may be configured such that the channel 125 is located above (or substantially above) the one or more ICs. The flexible DTIM 140 may be arranged within the void region provided by the channel 125. In addition, the heat pipe 130 may be configured such that at least a portion of the heat pipe 130 is located above (or substantially above) the flexible DTIM 140 included in the channel 125.

In the device 100, a lower surface of the flexible DTIM 140 may be thermally coupled to an upper surface of the heat sink 120 (e.g., a surface within the channel 125). In addition, an upper surface of the flexible DTIM 140 may be thermally coupled to a lower surface of the heat pipe 130. The flexible DTIM 140 may be configured such that a high-conductivity orientation of the flexible DTIM 140 is oriented perpendicular (or substantially perpendicular) to the lower and upper surfaces of the flexible DTIM 140. In addition, the high-conductivity orientation of the flexible DTIM 140 may be oriented to provide a high rate of heat transfer through the flexible DTIM 140 (e.g., thermal conductivity of about 5-10 W/mK), such as from the one or more ICs to the heat pipe 130, via the heat sink 120 and the flexible DTIM 140.

In some implementations, heat generated by the one or more ICs may be transferred to the heat pipe 130 via the high-conductivity orientation of the flexible DTIM 140. For example, heat (e.g., generated by the one or more ICs) may be transferred to the heat sink 120 via a first thermal coupling between the one or more ICs and the heat sink 120. Heat present in the heat sink 120 may be transferred to the flexible DTIM 140 via a second thermal coupling between the upper surface of the heat sink 120 and the lower surface of the flexible DTIM 140. Heat present in the flexible DTIM 140 may be transferred to the heat pipe 130 via a third thermal coupling between the upper surface of the flexible DTIM 140 and the lower surface of the heat pipe 130. In some cases, heat present in the heat pipe 130 may be transferred to the exterior of the housing 105, such as via a fourth thermal coupling between the heat pipe 130 and the external heat sink 110.

In some implementations, the heat pipe 130 may be capable of maintaining a flexible thermal coupling with the flexible DTIM 140 during movements with respect to the flexible DTIM 140. For instance, a force applied to the device 100 (e.g., wind striking the housing 105) may cause the heat pipe 130 to move with respect to the flexible DTIM 140. During the movements, heat present in the flexible DTIM 140 may transfer (or continue to transfer) to the heat pipe 130 via the flexible thermal coupling. In some cases, a flexible thermal coupling between the heat pipe 130 and the flexible DTIM 140 allows heat generated by the one of more ICs to be transferred to the exterior of the housing 105 during movements, while reducing a likelihood of damage to the device 100 (e.g., avoiding broken IC pins or damaged fastenings).

Figure 2:
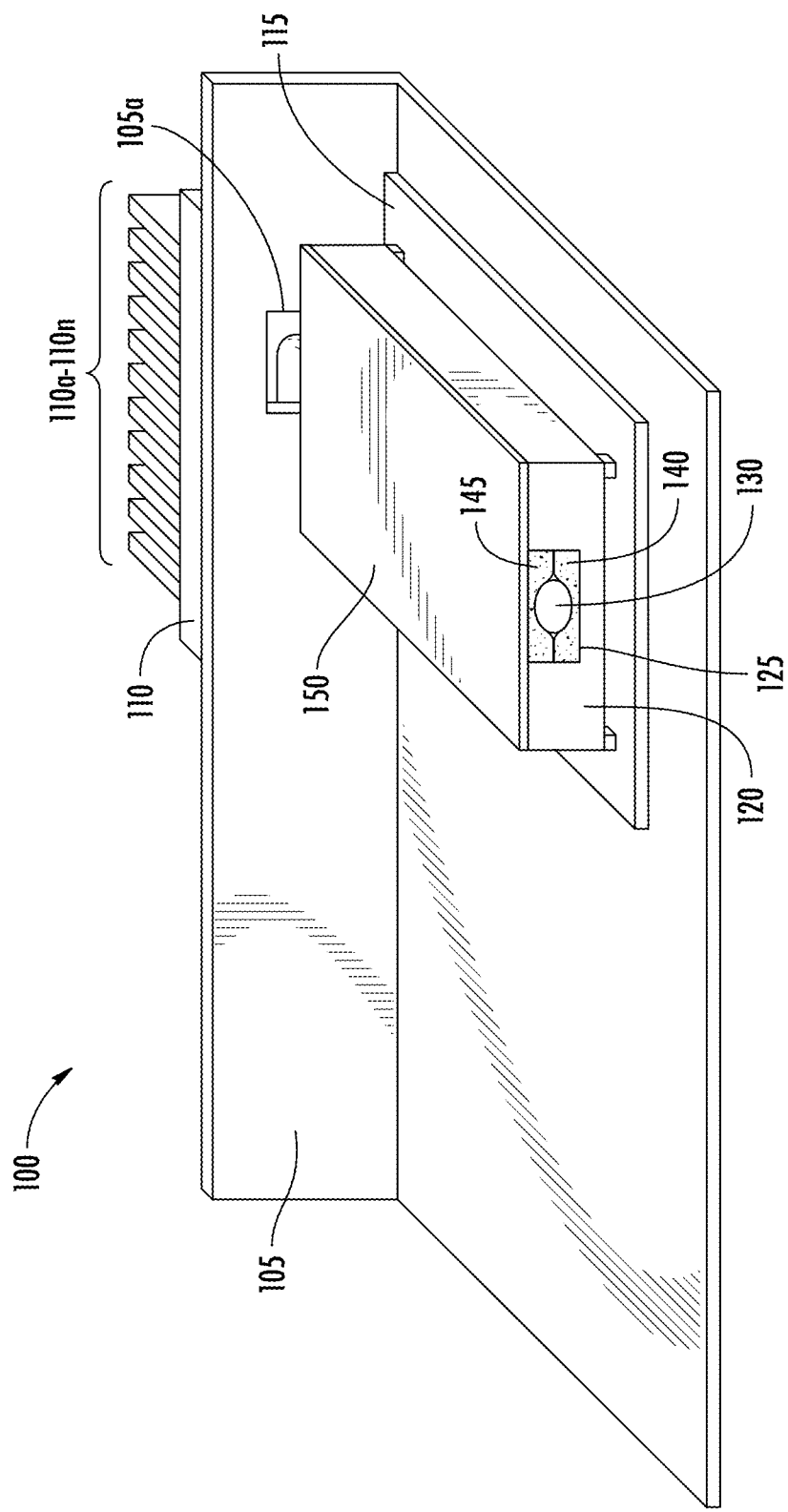
FIG. 2 is an isometric view of an example utility management device in which a compressive force is applied to a flexible DTIM, according to certain implementations.

In some cases, the heat pipe 130 may have a flexible thermal coupling with the flexible DTIM 140 without being fastened to the flexible DTIM 140. For example, the flexible thermal coupling may be provided by a compression of the flexible DTIM 140 between the heat pipe 130 and the heat sink 120, such as a compression within the channel 125. FIG. 2 is an isometric view of an example configuration of the device 100 in which an additional component, such as a heat sink 150, may apply a compressive force to one or more flexible DTIMs within the channel 125. The heat sink 150 may be configured for attachment to the heat sink 120, such as attachment by clasps, screws, or other suitable fixtures. In addition, the heat sink 150 may be configured for attachment to one or more raised regions of the heat sink 120, such as at least two raised regions along two or more sides of the channel 125. In some cases, the heat sink 150 may enclose (or substantially enclose) the channel 125, such as by covering the one or more void regions in the heat sink 120.

In some implementations, an additional flexible DTIM may be arranged within the void region provided by the channel 125. For example, an additional flexible DTIM 145 may be included within the channel 125. The heat pipe 130 (or a portion of the heat pipe 130) may be arranged within the channel 125 between the flexible DTIM 140 and the flexible DTIM 145. In addition, the heat sink 150, the heat pipe 130, or both may apply a compressive force to one or more of the flexible DTIMs 140 and 145. For example, the flexible DTIMs 140 and 145 may be compressed around the heat pipe 130 (e.g., via the enclosure of the channel 125 by the heat sink 150). In some cases, one or more of the flexible DTIMs 140 or 145 may each be compressed by about 5-30%.

Within the channel 125, the heat pipe 130 may be thermally coupled to one or more of the flexible DTIMs 140 or 145. For example, a lower surface of the heat pipe 130 may be thermally coupled to an upper surface of the flexible DTIM 140, and a lower surface of the flexible DTIM 140 may be thermally coupled to an upper surface of the heat sink 120. In addition, an upper surface of the heat pipe 130 may be thermally coupled to a lower surface of the flexible DTIM 145, and an upper surface of the flexible DTIM 145 may be thermally coupled to a lower surface of the heat sink 150. The flexible DTIM 145 may be configured such that a high-conductivity orientation of the flexible DTIM 145 is oriented perpendicular (or substantially perpendicular) to the lower and upper surfaces of the flexible DTIM 145. In addition, the high-conductivity orientation of the flexible DTIM 145 may be oriented to provide a high rate of heat transfer through the flexible DTIM 145 (e.g., thermal conductivity of about 5-10 W/mK), such as between the heat pipe 130 and the heat sink 150. In some cases, the thermal couplings between the heat pipe 130 and one or more of the flexible DTIMs 140 or 145 may be present at compressed areas of the flexible DTIMs 140 or 145, such as at surfaces of the flexible DTIMs that are compressed, at least in part, by the heat pipe 130.

In some implementations, the heat pipe 130 may be capable of maintaining flexible thermal couplings with one or more of the flexible DTIM 140 or the flexible DTIM 145 during movements with respect to the flexible DTIMs 140 or 145. During the movements of the heat pipe 130, heat present in one or more of the flexible DTIMs 140 or 145 may transfer (or continue to transfer) to the heat pipe 130 via the respective flexible thermal couplings. In some cases, the compression of the one or more flexible DTIMs 140 or 145, such as compression by the attachment of the heat sink 150 the heat sink 120, provides the flexible thermal couplings between the heat pipe 130 and the one or more flexible DTIMs 140 or 145.

In FIG. 2, the flexible DTIM 145 is arranged between the heat pipe 130 and the heat sink 150, but other configurations are possible. For example, an additional flexible material may be placed between the heat pipe 130 and the heat sink 150, such as a flexible material that allows movement of the heat pipe 130 without providing a thermal coupling to the heat sink 150. In addition, the heat pipe 130 may be configured to contact the heat sink 150 without a flexible material. In some cases, the heat pipe 130 and the heat sink 150 may comprise a single component, such as a thermally conductive component that is configured to compress the flexible DTIM 140 and transfer heat to the exterior of the housing 105.

Figure 3A:
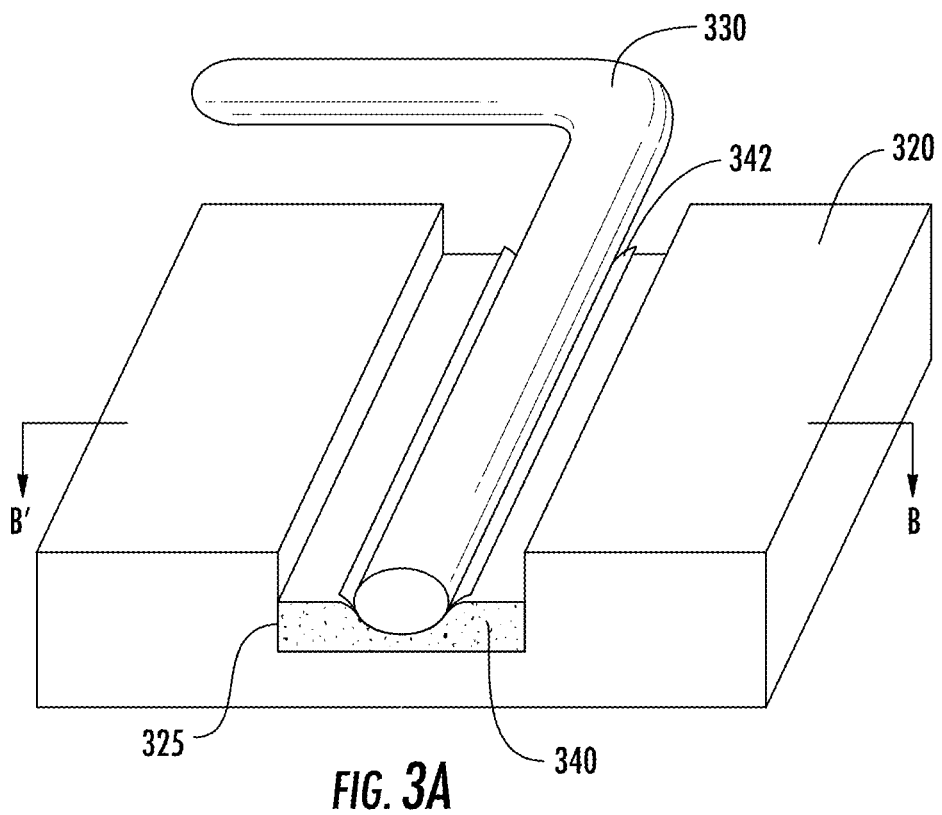
FIG. 3A is an isometric view of example thermal couplings between a flexible DTIM, a heat sink, and a heat pipe, according to certain implementations.

In some implementations, a thermal coupling, including a flexible thermal coupling, between a flexible DTIM and one or more of a heat sink or heat pipe may include an additional thermal interface material ("TIM"), such as a low-friction TIM. FIG. 3A is an isometric view of example thermal couplings between a flexible DTIM 340, a heat sink 320, and a heat pipe 330. In some cases, the example arrangement depicted in FIG. 3A may be included in a utility management device, such as the heat sink 120, heat pipe 130, and flexible DTIM 140 included in the device 100. In some cases, the example arrangement depicted in FIG. 3A may include one or more heat sources, such as a heat source arranged below the heat sink 320, that are not visible in the view of FIG. 3A.

In FIG. 3A, the heat sink 320 may include a channel 325, in which the flexible DTIM 340 may be arranged. The flexible DTIM 340 may be configured such that a high-conductivity orientation of the flexible DTIM 340 is oriented perpendicular (or substantially perpendicular) to lower and upper surfaces of the flexible DTIM 340. The heat pipe 330 may be arranged to have a first portion within the channel 325, and a second portion extending beyond the heat sink 320. In some cases, the second portion of the heat pipe 330 may extend outside of a device housing, such as a portion that extends outside of the housing 105 via the aperture 105a.

The flexible DTIM 340 may have respective thermal couplings with one or more of the heat sink 320 or the heat pipe 330. For example, a lower surface of the flexible DTIM 340 may be thermally coupled to an upper surface of the heat sink 320, such as at a surface within the channel 325. In addition, an upper surface of the flexible DTIM 340 may be thermally coupled to a lower surface of the heat pipe 330. In addition, the high-conductivity orientation of the flexible DTIM 340 may be oriented to provide a high rate of heat transfer through the flexible DTIM 340, such as between the heat sink 320 and the heat pipe 330.

In some cases, the thermal coupling between the flexible DTIM 340 and the heat pipe 330 may include an additional TIM, such as a low-friction TIM 342. For example, the low-friction TIM 342 may be arranged between the flexible DTIM 340 and the heat pipe 330. In addition, heat that is transferred between the flexible DTIM 340 and the heat pipe 330 may be transferred via the low-friction TIM 342. The low-friction TIM 342 may include any suitable low-friction material that has a relatively high rate of heat transfer, such as paper, grease, metallic paste, or any other suitable low-friction thermally conductive material.

Figure 3B:
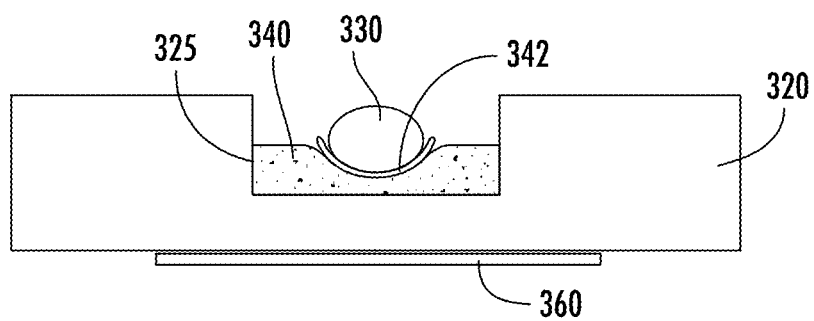
FIG. 3B is a cross-sectional view of example thermal couplings between a flexible DTIM, a heat sink, and a heat pipe, according to certain implementations.

FIG. 3B is a cross-sectional view of an additional view of the example thermal couplings between the flexible DTIM 340, the heat sink 320, and the heat pipe 330. The heat sink 320 may be configured such that one or more of the channel 325, the flexible DTIM 340, or at least a portion of the heat pipe 330 are located above (or substantially above) a heat source 360. In some implementations, the heat source 360 may include one or more ICs, such as described in regards to FIG. 1. FIG. 3B depicts a view at an example cut, such as a cut between points B and B' depicted in FIG. 3A.

In the arrangement depicted in FIG. 3B, heat that is generated by the heat source 360 may be transferred to the heat sink 320 via a first thermal coupling between the heat source 360 and the heat sink 320. Heat that is present in the heat sink 320 may be transferred to the flexible DTIM 340 via a second thermal coupling between the heat sink 320 and the flexible DTIM 340. In some cases, one or more of the first or second thermal couplings may include an additional TIM, such as a thermally conductive paper, grease, or paste, via which the heat is transferred.

The low-friction TIM 342 may be arranged between the flexible DTIM 340 and the heat pipe 330. Heat that is present in the flexible DTIM 340 may be transferred to the heat pipe 330 via a third thermal coupling between the flexible DTIM 340 and the heat pipe 330. The third thermal coupling may include the low-friction TIM 342. In some cases, the third thermal coupling may be a flexible thermal coupling, such that the heat pipe 330 is capable of maintaining the flexible thermal coupling with the flexible DTIM 340 during movements. In addition, the low-friction TIM 342 may provide or improve the flexible thermal coupling, such as by providing a low-friction thermally conductive surface over which the heat pipe 330 may move with respect to the flexible DTIM 340.

Figure 4A:
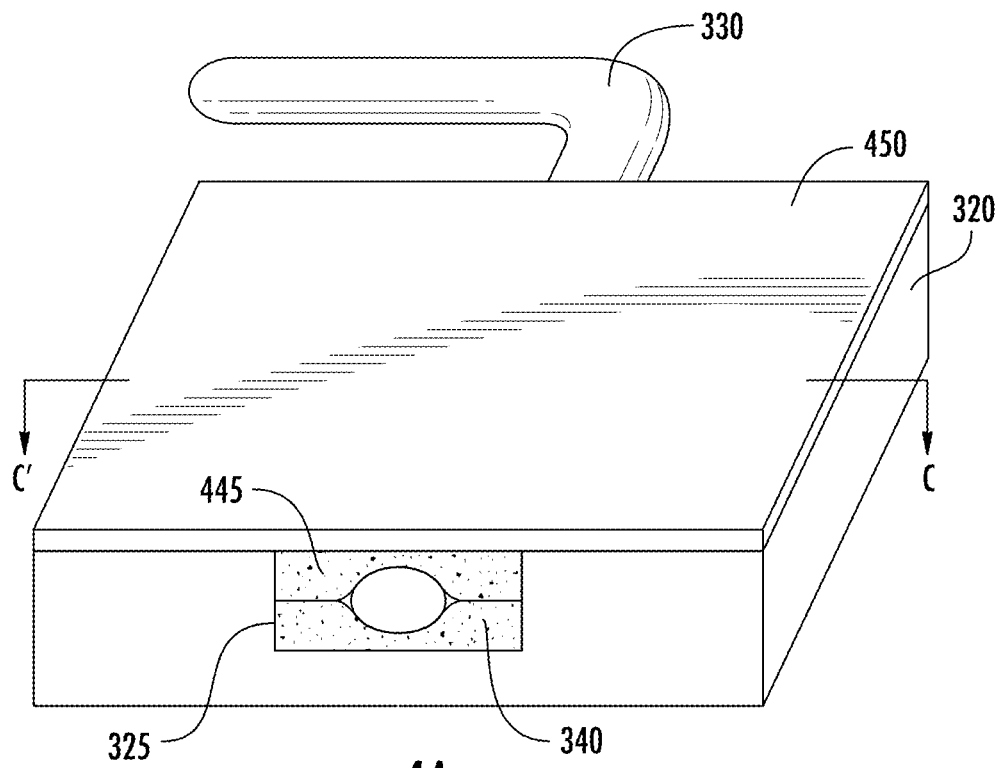
FIG. 4A is an isometric view of example thermal couplings between multiple flexible DTIMs, multiple heat sinks, and a heat pipe, according to certain implementations.

FIG. 4A is an isometric view depicting example thermal couplings between the flexible DTIM 340, the heat sink 320, the heat pipe 330, an additional heat sink 450, and an additional flexible DTIM 445. In some implantations, the heat sink 450 may be configured for attachment to the heat sink 320, such as described in regards to FIG. 2. In addition, the heat sink 450 may enclose (or substantially enclosed) the channel 325. The first portion of the heat pipe 330 may be arranged within the channel 325, such that the first portion of the heat pipe 330 is arranged between the heat sink 320 and the heat sink 450. In addition, the second portion of the heat pipe 330 may extend beyond the channel 325, the heat sink 320, and the heat sink 450.

In FIG. 4A, the flexible DTIM 340 and the additional flexible DTIM 445 may be arranged within the channel 325. The flexible DTIM 340 and the flexible DTIM 445 may each be configured such that respective high-conductivity orientations of the flexible DTIMs 340 and 445 are oriented perpendicular (or substantially perpendicular) to lower and upper surfaces of the flexible DTIMs 340 and 445. In addition, the first portion of the heat pipe 330 may be arranged between the flexible DTIMs 340 and 445 within the channel 325. The heat sink 450 may compress the flexible DTIMs 340 and 445, such as by compressing the flexible DTIMs around the first portion of the heat pipe 330.

The flexible DTIM 445 may have respective thermal couplings with one or more of the heat pipe 330 or the heat sink 450. For example, a lower surface of the flexible DTIM 445 may be thermally coupled to one or more of an upper surface of the heat pipe 330 or an upper surface of the flexible DTIM 340. In addition, an upper surface of the flexible DTIM 445 may be thermally coupled to a lower surface of the heat sink 450. In addition, the high-conductivity orientation of the flexible DTIM 445 may be oriented to provide a high rate of heat transfer through the flexible DTIM 435, such as between the heat pipe 330 and the heat sink 450.

In some cases, the thermal coupling between the flexible DTIM 445 and the heat pipe 330 may include an additional TIM, such as an additional low-friction TIM 444. For example, the low-friction TIM 444 may be arranged between the flexible DTIM 445 and the heat pipe 330. In addition, heat that is transferred between the flexible DTIM 445 and the heat pipe 330 may be transferred via the low-friction TIM 444.

Figure 4B:
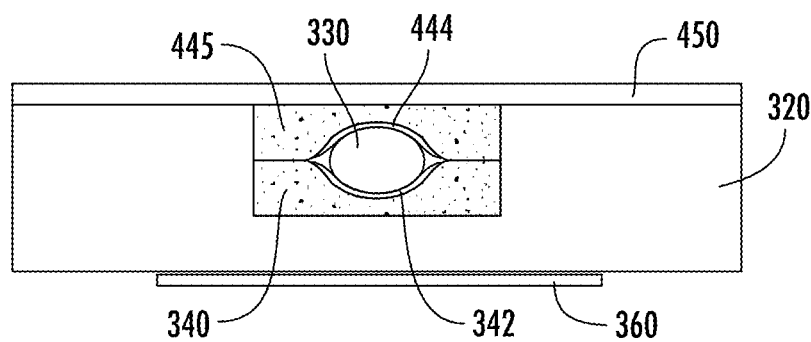
FIG. 4B is a cross-sectional view of example thermal couplings between multiple flexible DTIMs, multiple heat sinks, and a heat pipe, according to certain implementations.

FIG. 4B is a cross-sectional view depicting the example thermal couplings between the flexible DTIMs 340 and 445, the heat sinks 320 and 450, and the heat pipe 330. FIG. 4B depicts a view at an example cut, such as a cut between points C and C' depicted in FIG. 4A. In the arrangement depicted in FIG. 4B, heat that is present in the heat sink 450 may be transferred to the flexible DTIM 445 via a fourth thermal coupling between the heat sink 450 and the flexible DTIM 445. Heat that is present in the flexible DTIM 445 may be transferred to the heat pipe 330 via a fifth thermal coupling between the flexible DTIM 445 and the heat pipe 330. The fifth thermal coupling may include the low-friction TIM 444. In some cases, the fifth thermal coupling may be a flexible thermal coupling, such that the heat pipe 330 is capable of maintaining the flexible thermal coupling with the flexible DTIM 445 during movements. In addition, the low-friction TIM 444 may provide or improve the flexible thermal coupling, such as by providing a low-friction thermally conductive surface over which the heat pipe 330 may move with respect to the flexible DTIM 435.

In some cases, compression of the flexible DTIMs 340 and 445, such as by the attachment of the heat sink 450 to the heat sink 320, may provide one or more thermal couplings at surfaces that are perpendicular to high-conductivity orientations of the flexible DTIMs 340 and 445. For example, compression of the flexible DTIM 340 may provide a relatively high rate of heat transfer at the thermal coupling between the heat sink 320 and the flexible DTIM 340, through the flexible DTIM 340 via the high-conductivity orientation of the flexible DTIM 340, and into the heat pipe 330 at the thermal coupling between the flexible DTIM 340 and the heat pipe 330. In addition, compression of the flexible DTIM 445 may provide a relatively high rate of heat transfer at the thermal coupling between the heat sink 450 and the flexible DTIM 445, through the flexible DTIM 445 via the high-conductivity orientation of the flexible DTIM 445, and into the heat pipe 330 at the thermal coupling between the flexible DTIM 445 and the heat pipe 330.

Figure 4C:
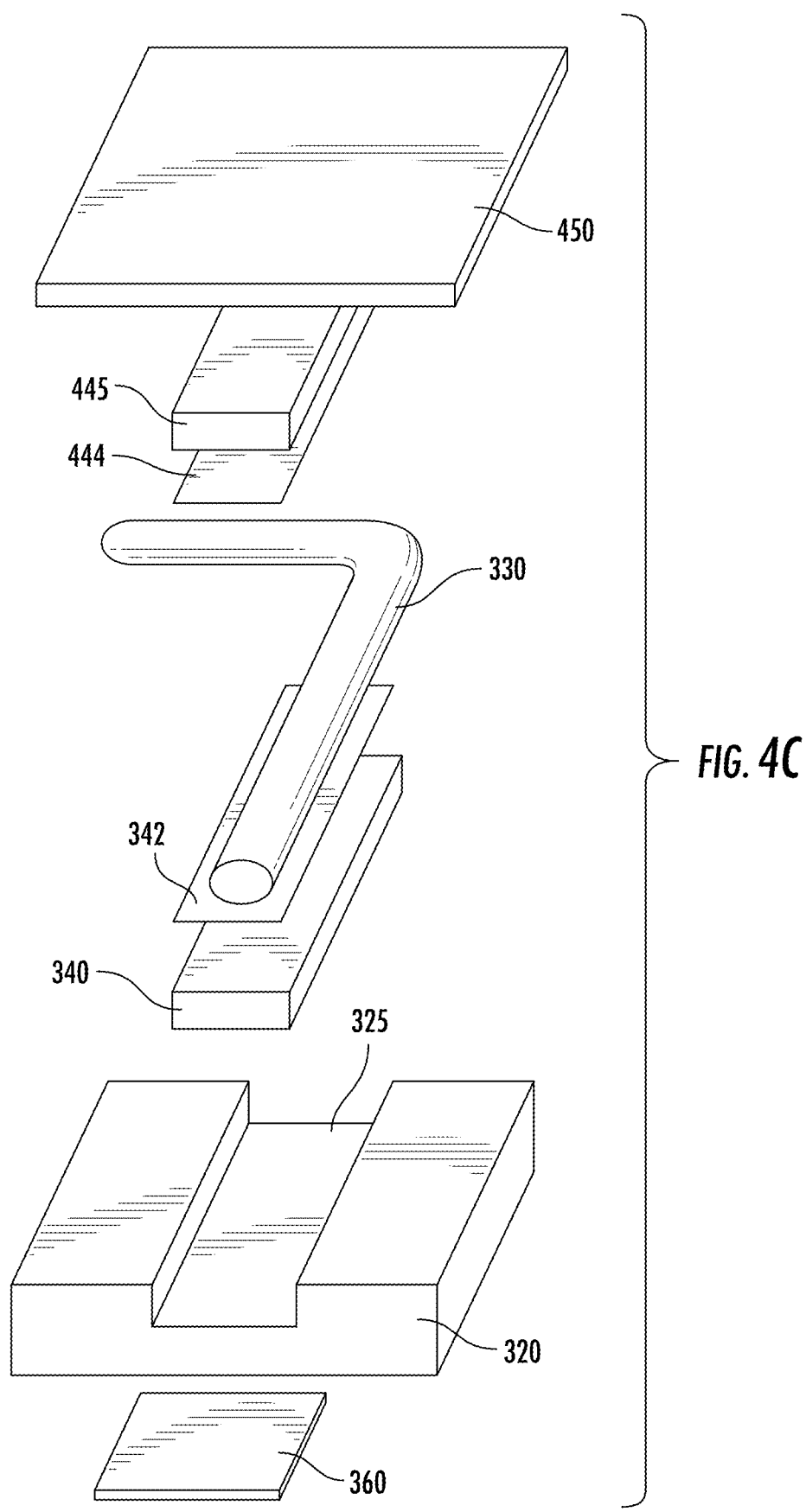
FIG. 4C is an exploded view of an example configuration of multiple flexible DTIMs, multiple heat sinks, and a heat pipe, according to certain implementations.

FIG. 4C is an exploded diagram depicting an example arrangement of the flexible DTIMs 340 and 445, the low-friction TIMs 342 and 444, the heat sinks 320 and 450, and the heat pipe 330. In FIG. 4C, components may be described as having relative positions, such as "above" or "below," but these descriptions are for convenience, and are not to be considered limiting. For example, depending on an arrangement of thermal management components within a device, a component that is described as "above" another component could be also described as being "beside," "in front of," or "behind" the other component.

In FIG. 4C, the heat pipe 330 may be arranged between the flexible DTIMs 340 and 445. In addition, the heat pipe 330 may be arranged between the low-friction TIMs 342 and 444, such that the low-friction TIM 342 is between the heat pipe 330 and the flexible DTIM 340, and the low-friction TIM 344 is between the heat pipe 330 and the flexible DTIM 445. The heat pipe 330, the low-friction TIMs 342 and 444, and the flexible DTIMs 340 and 445 may be arranged to fit within the channel 325 of the heat sink 320. The heat sink 450 may be arranged above the heat sink 320 and above the flexible DTIM 445, such that flexible DTIMs 340 and 445 are compressed around the heat pipe 330 and the low-friction TIMs 342 and 444 via an attachment of the heat sink 450 to the heat sink 320. The heat sink 320 may be arranged above the heat source 360. FIG. 4C depicts the low-friction TIMs 342 and 444 as being between the heat pipe 330 and the flexible DTIMs 340 and 445, but other implementations are possible, such as a heat pipe between flexible DTIMs without a low-friction TIM. In some implementations, additional TIMs (e.g., thermally conductive oil, metallic paste) are included between components, such as between the heat sink 320 and the heat source 360, or between other suitable components.

Figure 5:
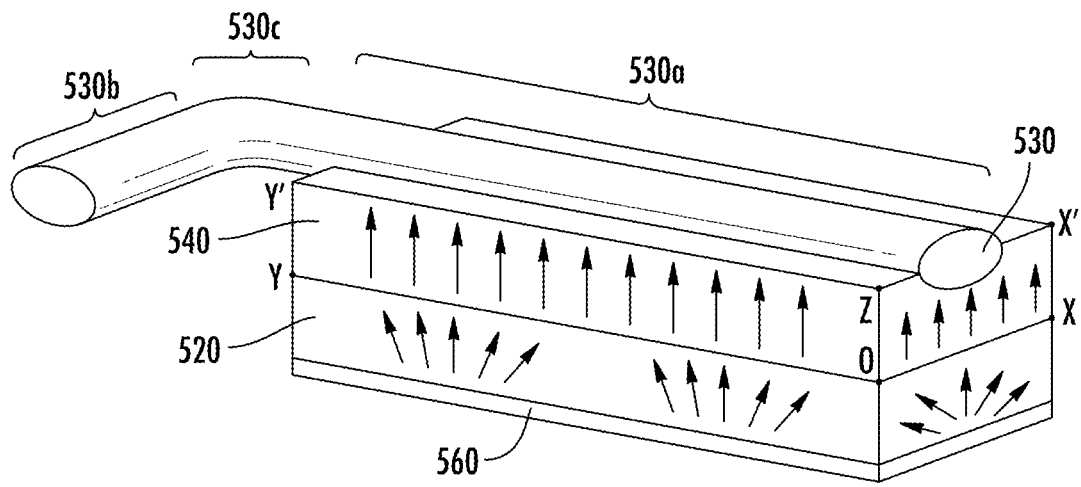
FIG. 5 is a diagram depicting an example of heat transfer from a heat source to a heat pipe, according to certain implementations.

FIG. 5 is a diagram depicting an example of how heat may be transferred from a heat source 560 to a heat pipe 530. In the example arrangement depicted in FIG. 5, the heat source 560 has a thermal coupling with a heat sink 520; the heat sink 520 has a thermal coupling with a flexible DTIM 540; and the flexible DTIM 540 has a thermal coupling with the heat pipe 530. In FIG. 5, a general transfer of heat is diagrammatically represented by arrows, but these diagrammatic representations should be considered non-limiting, and the motion of transferred heat may be impacted by conditions not depicted in FIG. 5. For example, although heat may generally transfer towards the heat pipe 530, some of the heat may be transferred to or dispersed by other components, such as a portion of heat dispersed by surfaces of the heat sink 520 that are not thermally coupled to the heat source 560 or the flexible DTIM 540.

In FIG. 5, some or all of the heat that is generated by the heat source 560 may be transferred to the heat sink 520. Within the heat sink 520, heat may generally transfer in a vertical direction (e.g., towards the flexible DTIM 540), with some lateral transfer of heat. Some or all of the heat that is present in the heat sink 520 may be transferred to the flexible DTIM 540. Within the flexible DTIM 540, heat may transfer in a direction of a high-conductivity orientation of the flexible DTIM 540, such as in a vertical direction (e.g., towards the heat pipe 530), with little or no lateral transfer of heat. For example, some or all of the heat that is received at the thermal coupling diagrammatically indicated by the line between point O and point X may travel along the high-conductivity orientation towards the line between point Z and point X'. In addition, some or all of the heat that is received at the thermal coupling diagrammatically indicated by the line between point O and point Y may travel along the high-conductivity orientation towards the line between point Z and point Y'. Some or all of the heat that is transferred towards the thermal coupling diagrammatically indicated by the line Z-X' and the line Z-Y' may be transferred to the heat pipe 530. In some cases, a portion of the heat may be transferred to, or dispersed by, one or more of an additional flexible DTIM or an additional heat sink that encloses the heat pipe 530 within a void region (e.g., the flexible DTIM 445 or heat sink 450 depicted in regards to FIG. 4A).

In some implementations, a heat pipe, such as the heat pipe 530, may have one or more elongate portions, such as the elongate portion 530a or the elongate portion 530b. The elongate portions 530a and 530b may be joined by a curved portion, such as a curved portion 530c. The elongate portion 530a may maintain a flexible thermal coupling with a flexible DTIM, such as the flexible DTIM 540. In addition, the elongate portion 530b may maintain thermal coupling (including a flexible thermal coupling) with an additional thermal management component, such as one or more of an additional heat sink or an additional flexible DTIM. In some cases, one or more of the elongate portion 530b, the curved portion 530c, or a part of the elongate portion 530a may extend outside of a housing (e.g., as described in regards to the housing 105 in FIG. 1), such that heat transferred into the heat pipe 530 is transferred outside of the housing via the elongate portion 530b, the curved portion 530c, or the part of the elongate portion 530a.

Figure 6:
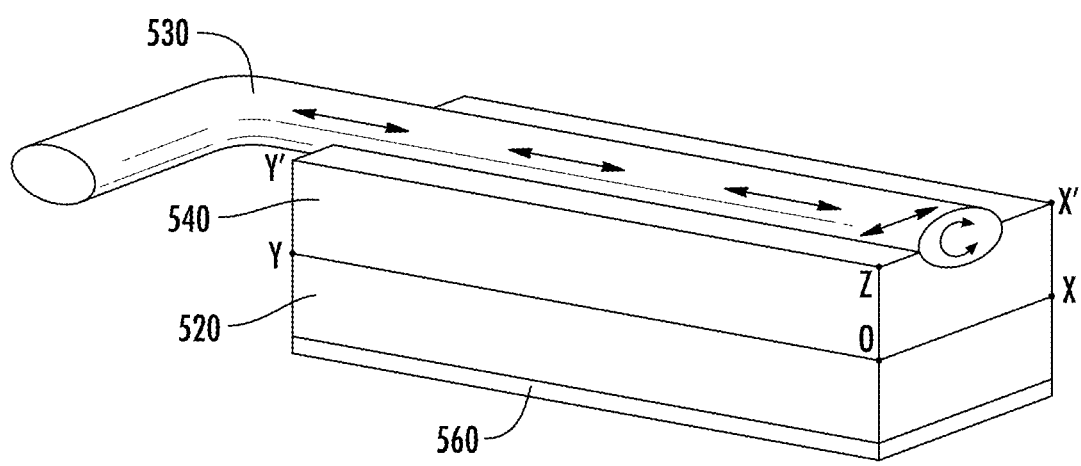
FIG. 6 is a diagram depicting an example of movement of a heat pipe relative to a flexible DTIM, according to certain implementations.

FIG. 6 is a diagram depicting an example of how the heat pipe 530 may move relative to the flexible DTIM 540. In FIG. 6, general movements of the heat pipe 530 are diagrammatically represented by arrows, but these diagrammatic representations should be considered non-limiting, and movements of the pipe 530, or other components, may be impacted by conditions not depicted in FIG. 5.

In FIG. 6, the heat pipe 530 may experience lateral movements, such as movements diagrammatically indicated by a line between point Z and point X'. In addition, the heat pipe 530 may experience longitudinal movements, such as movements diagrammatically indicated by a line between point Z and point Y'. Furthermore, the heat pipe 530 may experience rotational movements, such as movements around one or more axes of the heat pipe 530. A flexible thermal coupling, such as described elsewhere herein, may be maintained between the heat pipe 530 and the flexible DTIM 540 during the lateral, longitudinal, or rotational movements of the heat pipe 530.

Figure 7:
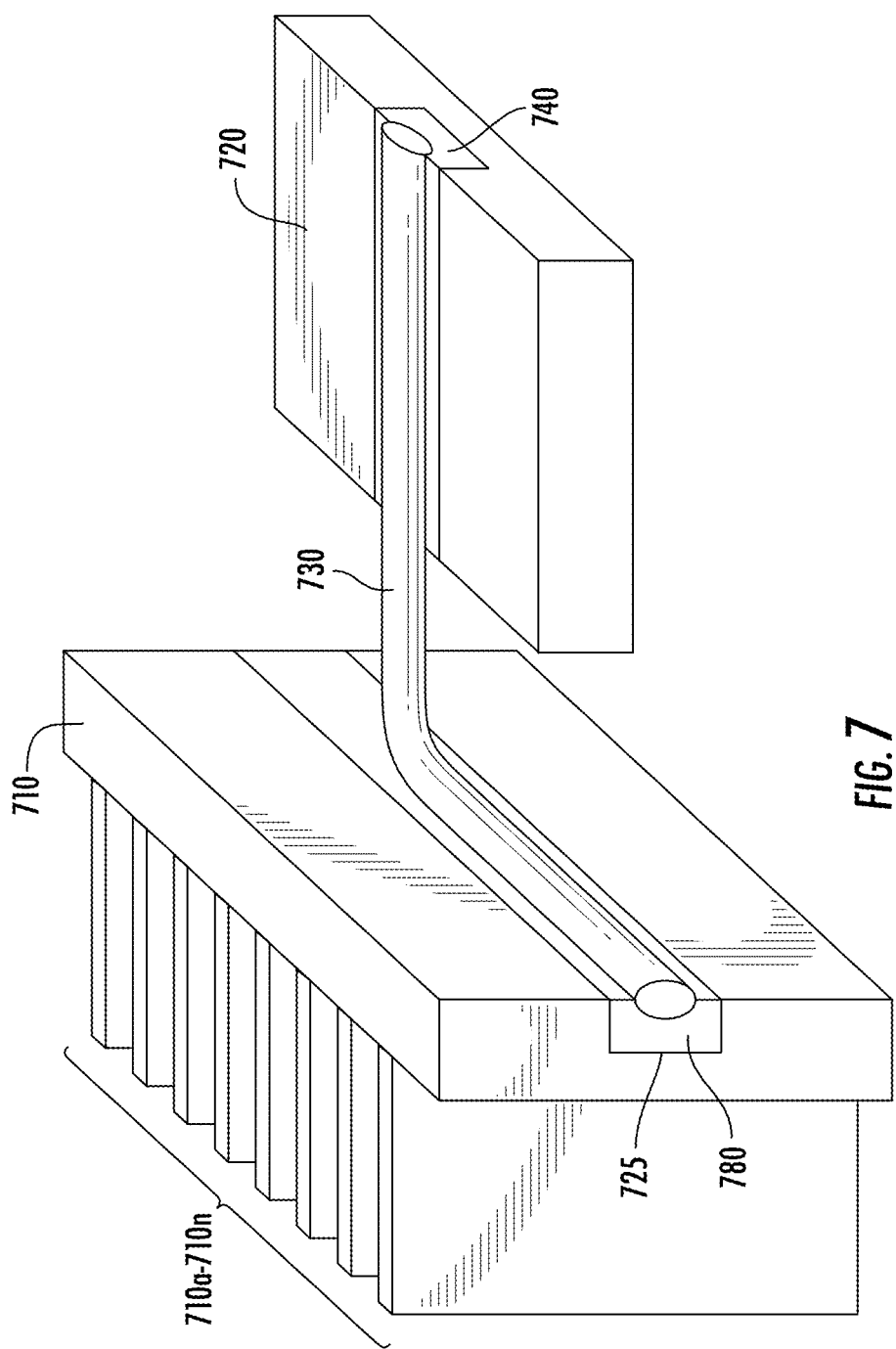
FIG. 7 is an isometric view of an example of a heat pipe that maintains multiple flexible thermal couplings with multiple heat sinks via multiple flexible DTIMs, according to certain implementations.

FIG. 7 is an isometric view of an example of a heat pipe 730 that may maintain multiple flexible thermal couplings with multiple heat sinks via multiple flexible DTIMs. In some cases, the heat pipe 730 may be included in a device, such as a utility management device in a utility distribution system. In some implementations, the heat pipe 730 may extend between the first heat sink 720 and a first flexible DTIM 740, and a second heat sink 710 and a second flexible DTIM 780. In some cases, the first heat sink 720 and the first flexible DTIM 740 may be included within a device housing, such as the housing 105 described in regards to FIG. 1. In addition, the second heat sink 710 and the second flexible DTIM 780 may be exterior to the device housing, as further described in regards to FIG. 1.

In FIG. 7, the heat pipe 730 may have a first flexible thermal coupling with the first heat sink 720 via the first flexible DTIM 740. For example, a first elongate portion of the heat pipe 730 may be arranged with the first flexible DTIM 740 within a void region of the heat sink 720. In addition, the first flexible DTIM 740 may be compressed, such as by one or more of an additional flexible DTIM or an additional heat sink that may attach to the heat sink 720. In some cases, the first flexible DTIM 740 may be configured such that a high-conductivity orientation of the flexible DTIM 740 is oriented perpendicular (or substantially perpendicular) to lower and upper surfaces of the flexible DTIM 740. In addition, the flexible DTIM 740 may be arranged to provide a high rate of heat transfer via the high-conductivity orientation. For example, heat that is present in the heat sink 720 (e.g., from one or more ICs) may be transferred to the heat pipe 730 via the high-conductivity orientation of the flexible DTIM 740.

In FIG. 7, the heat pipe 730 may have a second flexible thermal coupling with the second heat sink 710 via the second flexible DTIM 780. The flexible DTIM 780 may be arranged within one or more void regions of the heat sink 710, such as the void region provided by a channel 725. In addition, a second elongate portion of the heat pipe 730 may be thermally coupled to the flexible DTIM 780. For example, a lateral surface of the heat pipe 730 may be thermally coupled to a lateral surface of the flexible DTIM 780.

The flexible DTIM 780 may be thermally coupled with the heat sink 710 to a lateral surface of the heat sink 710 (e.g., a lateral surface within the channel 725) the flexible DTIM 780 may be configured such that a high-conductivity orientation of the flexible DTIM 780 is oriented perpendicular (or substantially perpendicular) to the lateral surfaces of the heat pipe 730 and the heat sink 710. In addition, the high-conductivity orientation of the flexible DTIM 780 may be oriented to provide a high rate of heat transfer through the flexible DTIM 780, such as from the heat pipe 730 to the heat sink 710. In some implementations, the flexible DTIM 780 may be compressed, such as by an additional heat sink that is configured to attach to the heat sink 710. For example, the second elongate portion of the heat pipe 730 may be arranged between the flexible DTIM 780 and the additional flexible DTIM, such that the additional heat sink encloses (or substantially encloses) the flexible DTIMs and the heat pipe 730 within the channel 725.

In some implementations, heat generated by a heat source (e.g., one or more ICs) may be transferred to the heat sink 710 via the respective high-conductivity orientations of the flexible DTIMs 740 and 780. For example, heat may be transferred to the first elongate portion of the heat pipe 730 via respective thermal couplings between the heat sink 720, the flexible DTIM 740, and the heat pipe 730. The high-conductivity orientation of the flexible DTIM 740 may provide a high rate of heat transfer to the first elongate portion of the heat pipe 730.

Heat present in the first elongate portion of heat pipe 730 may be transferred to the second elongate portion of the heat pipe 730 via a curved portion of the heat pipe 730. In some cases, the curved portion extends outside of a device housing (e.g., the housing 105), such that heat transferred into the second elongate portion of the heat pipe 730 is transferred outside of the device housing. In addition, the heat pipe 730 may maintain respective flexible thermal couplings with the flexible DTIMs 740 and 780 during movements of the heat pipe 730 with respect to one or more of the flexible DTIMs 740 or 780. The respective flexible thermal couplings may maintain heat transfer from within the device housing to outside of the device housing throughout any movements of the heat pipe 730.

In addition, heat present in the second elongate portion of the heat pipe 730 may be transferred to the heat sink 710 via respective thermal couplings between the heat pipe 730, the flexible DTIM 780, and the heat sink 710. The high-conductivity orientation of the flexible DTIM 780 may provide a high rate of heat transfer from the second elongate portion of the heat pipe 730. Heat that is present in the heat sink 710 may be dispersed, such as via one or more fins 710a through 710n. In some cases, the fins 710a-710n may be configured to interact with one or more additional thermal management components, such as a fan, a vent, or an air channel.

FIG. 8 is a diagram depicting an example of a utility distribution system 800 that includes one or more utility management devices, such as a utility management device 810 or a utility management device 840. The utility management devices 810 or 840 may each be a meter, a collector, a router, or other type of device that is capable of gathering data regarding consumption of a measured utility that is distributed via the utility distribution system 800.

In some cases, the utility distribution system 800 may include one or more structures that shelter (or partially shelter) one or more utility management devices. For example, a utility access structure 820 may partially shelter the utility management device 810. The utility access structure 820 may be an enclosed structure, such as a building or shed having walls and a roof. In addition, the utility access structure 820 may be partially enclosed, such as a structure that includes a roof and supports, but lacks one or more walls. Furthermore, the utility access structure 820 may be an open structure, such as a structure with open walls (e.g., chain link fence, security grating) and an open roof, or lacking a roof.

In some cases, the utility distribution system 800 may include one or more utility poles on which one or more utility management devices are mounted. For example, a utility pole 830 may have the utility management device 840 mounted upon it. The utility management device 840 may be mounted on the utility pole 830 at a height above the ground (e.g., a height between 2-20 m)

The utility management devices 810 and 840 may be subjected to physical forces while in use in the utility distribution system 800. For example, the utility access structure 820 or the utility pole 830 may provide little or no shelter from environmental conditions, such as precipitation, temperature changes, wind, debris, animal interference, or other environmental conditions that may cause motion. In addition, the utility management devices 810 or 840 may experience physical forces from human handling, such as shipping, installation, maintenance, tampering (e.g., vandalism), or other handling that may cause motion.

In some implementations, one or more of the utility management devices 810 or 840 may include thermal management components that have flexible thermal couplings, such as described elsewhere herein. For example, one or more of the utility management devices 810 or 840 may include a respective heat pipe with at least one flexible thermal coupling with one or more flexible DTIMs, such as heat pipe 730 or the flexible DTIMs 740 or 780, as described in regards to FIG. 7. The utility management device 810 is shown with external thermal dispersion fins, such as fins 110a-110n described in regards to FIG. 1, but other configurations are possible, including configurations that omit external fins. The utility management device 840 is shown without external thermal dispersion fins, but other configurations are possible, including configurations that include external fins.

In some cases, inclusion of one or more flexible thermal couplings in the utility management devices 810 or 840 may improve performance of components included in one or more of the utility management devices 810 or 840. For example, a flexible thermal coupling may improve operation and/or lifespan of one or more ICs, such as by maintaining thermal coupling during movements caused by physical forces experienced by the utility management devices 810 or 840. In addition, a flexible thermal coupling may improve reliability and/or extend lifespan of the utility management devices 810 or 840, such as by preventing breakage of internal components (e.g., solder joints, IC pins, physical fastenings). Furthermore, a flexible thermal coupling may reduce a likelihood of failure of the utility management devices 810 or 840, and could result in improved operation of the devices, as well as reducing costs related to replacement or maintenance.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Although the techniques and components described herein are described with regards to utility management devices in a utility distribution system, other implementations or applications are envisioned, including implementation in a device that is not included in a utility distribution system. Such implementations or applications are deemed to be within the scope of the present disclosure.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific implementations thereof, it will be appreciated that those skilled in the art, upon attaining an understanding of the foregoing, may readily produce alterations to, variations of, and equivalents to such implementations. Accordingly, it should be understood that the present disclosure has been presented for purposes of example rather than limitation, and does not preclude inclusion of such modifications, variations, and/or additions to the present subject matter as would be readily apparent to one of ordinary skill in the art.

What is claimed is:

1. A device of a utility distribution system, the device comprising:
   a housing;
   an integrated circuit mounted to a printed circuit board that is included within the housing;
   a first heat sink, the first heat sink being thermally coupled to the integrated circuit, the first heat sink having a void region;
   a second heat sink that is attached to the first heat sink, the second heat sink substantially enclosing the void region;
   a flexible directional thermal interface material (DTIM) having a high-conductivity orientation, wherein the high-conductivity orientation provides a high rate of heat transfer between a first surface of the flexible DTIM and a second surface of the flexible DTIM, the flexible DTIM being arranged within the void region and between the first heat sink and the second heat sink; and
   a heat pipe that compresses at least a portion of the flexible DTIM, the heat pipe being arranged between the first heat sink and the second heat sink,
   wherein the first surface of the flexible DTIM is thermally coupled with the heat pipe, and the second surface of the flexible DTIM is thermally coupled with the first heat sink,
   wherein the heat pipe is capable of movements with respect to the flexible DTIM,
   wherein during the movements, the first surface maintains the thermal coupling with the heat pipe and the second surface maintains the thermal coupling with the first heat sink, such that, during the movements, heat present in the first heat sink is transferred to the heat pipe via the high-conductivity orientation of the flexible DTIM.

2. The device of claim 1, further comprising a low-friction thermal interface material that is arranged between the heat pipe and the flexible DTIM, wherein the low-friction thermal interface material provides the thermal coupling of the first surface of the flexible DTIM with the heat pipe.

3. The device of claim 1, further comprising an additional flexible DTIM, wherein:
   the heat pipe is arranged between the flexible DTIM and the additional DTIM, such that the first surface of the flexible DTIM is thermally coupled with a lower surface of the heat pipe,
   a third surface of the additional flexible DTIM is thermally coupled with an upper surface of the heat pipe, and a fourth surface of the additional flexible DTIM is thermally coupled with the second heat sink, and
   the heat pipe is capable of additional movements with respect to the additional flexible DTIM, such that during the additional movements, the third surface maintains the thermal coupling with the upper surface of the heat pipe.

4. The device of claim 3, wherein:
the void region of the first heat sink is arranged as a channel between at least two raised regions of the first heat sink, the channel having a elongate surface and an elongate opening, the second heat sink being attached to the first heat sink via the at least two raised regions,
the second heat sink provides a covering surface that covers the elongate opening, and
the flexible DTIM, the additional flexible DTIM, and the heat pipe are arranged within the channel, such that the second surface of the flexible DTIM is thermally coupled with the elongate surface of the channel, and the fourth surface of the additional flexible DTIM is thermally coupled with the covering surface of the second heat sink.

5. The device of claim 4, wherein:
the second heat sink compresses the flexible DTIM and the additional flexible DTIM,
such that the compression increases the high rate of heat transfer of the flexible DTIM.

6. The device of claim 1, further comprising an additional heat sink arranged exterior to the housing, wherein:
the heat pipe has a first elongate portion and a second elongate portion,
the first surface of the flexible DTIM is thermally coupled with the first elongate portion of the heat pipe, and
the second elongate portion of the heat pipe is thermally coupled with the additional heat sink,
such that heat present in the heat pipe is transferred to the additional heat sink.

7. The device of claim 6, further comprising an additional flexible DTIM having an additional high-conductivity orientation, wherein the additional high-conductivity orientation provides an additional high rate of heat transfer between a third surface of the additional flexible DTIM and a fourth surface of the additional flexible DTIM, wherein:
the second elongate portion of the heat pipe is thermally coupled with the third surface of the additional flexible DTIM,
the additional heat sink is thermally coupled with the fourth surface of the additional flexible DTIM,
the heat pipe is capable of additional movements with respect to the additional flexible DTIM, and
during the additional movements, the third surface maintains the thermal coupling with the second elongate portion of the heat pipe and the fourth surface maintains the thermal coupling with the additional heat sink, such that, during the additional movements, the heat present in the heat pipe is transferred to the additional heat sink via the additional high-conductivity orientation of the additional flexible DTIM.

8. The device of claim 6, wherein the additional heat sink comprises fins configured for dispersing, exterior to the housing, the heat transferred to the additional heat sink.

9. The device of claim 6, wherein the heat pipe further has a curved portion, the first elongate portion and the second elongate portion being joined by the curved portion.

10. A flexible thermal coupling, the flexible thermal coupling comprising:
a heat sink that is configured to be thermally coupled to a heat source;
a heat pipe that is configured to be thermally coupled to an additional heat sink; and
a flexible directional thermal interface material (DTIM) having a high-conductivity orientation, wherein the high-conductivity orientation provides a high rate of heat transfer between a first surface of the flexible DTIM and a second surface of the flexible DTIM,
wherein the flexible DTIM is arranged between the heat sink and the heat pipe,
wherein the heat sink is thermally coupled to the heat pipe via the flexible DTIM,
wherein the heat pipe is capable of movements with respect to one or more of (i) the heat sink or (ii) the additional heat sink,
wherein during the movements, the first surface maintains a first thermal coupling with the heat sink and the second surface maintains a second thermal coupling with the heat pipe, such that, during the movements, heat present in the heat sink is transferrable to the heat pipe via the high-conductivity orientation of the flexible DTIM.

11. The flexible thermal coupling of claim 10, wherein:
the heat pipe comprises a first elongate portion and a second elongate portion,
the second surface of the flexible DTIM is thermally coupled with the first elongate portion, and
the second elongate portion is configured to be thermally coupled with the additional heat sink, such that heat present in the heat pipe is transferrable to the additional heat sink.

12. The flexible thermal coupling of claim 11, wherein:
the additional heat sink comprises an additional flexible DTIM having an additional high-conductivity orientation, wherein the additional high-conductivity orientation provides an additional high rate of heat transfer between a third surface of the additional flexible DTIM and a fourth surface of the additional flexible DTIM, and the additional heat sink is thermally coupled with the third surface of the additional flexible DTIM,
the second elongate portion is configured to be thermally coupled with the fourth surface of the additional flexible DTIM, and
during the movements, the third surface provides the thermal coupling with the additional heat sink and the fourth surface provides the thermal coupling with the second elongate portion, such that, during the movements, the heat present in the heat pipe is transferrable to the additional heat sink via the additional high-conductivity orientation of the flexible DTIM.

13. The flexible thermal coupling of claim 11, wherein the heat pipe further comprises a curved portion, the first elongate portion and the second elongate portion being joined by the curved portion.

14. The flexible thermal coupling of claim 10, wherein the additional heat sink comprises fins configured for dispersing heat transferred from the heat pipe to the additional heat sink.

15. The flexible thermal coupling of claim 10, further comprising a low-friction thermal interface material that is arranged between the heat pipe and the flexible DTIM, wherein the low-friction thermal interface material provides the thermal coupling of the second surface of the flexible DTIM with the heat pipe.

16. The flexible thermal coupling of claim 10, wherein:
the heat pipe has an elongate portion, and
the flexible DTIM has an elongate interior void that is configured to receive the elongate portion.

17. The flexible thermal coupling of claim 10, wherein the heat sink has a channel that is configured to receive the flexible DTIM.

18. The flexible thermal coupling of claim 17, wherein the channel is enclosed by a portion of the heat sink.

19. The flexible thermal coupling of claim 18, wherein the portion of the heat sink provides a compression of the flexible DTIM, such that the compression increases the high rate of heat transfer of the flexible DTIM.

\* \* \* \* \*